United States Patent
Meyer et al.

(10) Patent No.: US 10,917,097 B1
(45) Date of Patent: Feb. 9, 2021

(54) CIRCUITS AND METHODS FOR TRANSFERRING TWO DIFFERENTIALLY ENCODED CLIENT CLOCK DOMAINS OVER A THIRD CARRIER CLOCK DOMAIN BETWEEN INTEGRATED CIRCUITS

(71) Applicant: Microsemi Semiconductor ULC, Kanata (CA)

(72) Inventors: Peter Meyer, Ottawa (CA); Kamran Rahbar, Kanata (CA); Drew Jenkins, Richardson, TX (US)

(73) Assignee: Microsemi Semiconductor ULC, Kanata (CA)

( * ) Notice: Subject to any disclaimer, the term of this patent is extended or adjusted under 35 U.S.C. 154(b) by 0 days.

(21) Appl. No.: 16/795,520

(22) Filed: Feb. 19, 2020

Related U.S. Application Data

(60) Provisional application No. 62/953,301, filed on Dec. 24, 2019.

(51) Int. Cl.
*H03D 3/24* (2006.01)
*H03L 7/07* (2006.01)

(52) U.S. Cl.
CPC ............ *H03L 7/07* (2013.01); *H03L 2207/50* (2013.01)

(58) Field of Classification Search
CPC ........................ H03L 7/07; H03L 2207/50
See application file for complete search history.

(56) References Cited

U.S. PATENT DOCUMENTS

| | | | |
|---|---|---|---|
| 5,343,482 A | 8/1994 | Penner et al. | |
| 5,371,765 A | 12/1994 | Guilford | |
| 5,600,824 A | 2/1997 | Williams et al. | |
| 5,640,398 A | 6/1997 | Carr et al. | |
| 5,838,512 A | 11/1998 | Okazaki | |
| 5,850,422 A | 12/1998 | Chen | |
| 5,905,766 A | 5/1999 | Nguyen | |
| 6,044,122 A | 3/2000 | Ellersick et al. | |
| 6,052,073 A | 4/2000 | Carr et al. | |
| 6,138,061 A | 10/2000 | McEnnan et al. | |
| 6,150,965 A | 11/2000 | Carr et al. | |

(Continued)

FOREIGN PATENT DOCUMENTS

WO 2003039061 A2 5/2003

OTHER PUBLICATIONS

8A34003 Datasheet (Integrated Device Technology, Inc) Jun. 17, 2019 (Jun. 17, 2019).

(Continued)

*Primary Examiner* — Dhaval V Patel
(74) *Attorney, Agent, or Firm* — Glass and Associates; Kenneth Glass

(57) ABSTRACT

A method for transferring first and second encoded client clock signals over a carrier clock domain between integrated circuits, including in a first integrated circuit encoding a phase change of the first client clock signal from a last recorded phase onto the carrier clock signal in first bit positions, encoding a phase change of the second client clock signal from a last recorded phase onto the carrier clock signal in second bit positions different from the first bit positions, and transmitting the carrier clock signal with the encoded phases of the first client clock signal and the second client clock signal over a single wire from the first integrated circuit to a second integrated circuit.

16 Claims, 5 Drawing Sheets

(56) References Cited

U.S. PATENT DOCUMENTS

| | | |
|---|---|---|
| 6,188,699 B1 | 2/2001 | Lang et al. |
| 6,333,935 B1 | 12/2001 | Carr et al. |
| 6,345,052 B1 | 2/2002 | Tse et al. |
| 6,359,479 B1 | 3/2002 | Oprescu |
| 6,584,521 B1 | 6/2003 | Dillabough et al. |
| 6,603,776 B1 | 8/2003 | Fedders et al. |
| 6,668,297 B1 | 12/2003 | Karr et al. |
| 6,671,758 B1 | 12/2003 | Cam et al. |
| 6,744,787 B1 | 6/2004 | Schatz et al. |
| 6,820,159 B2 | 11/2004 | Mok et al. |
| 6,823,001 B1 | 11/2004 | Chea |
| 6,870,831 B2 | 3/2005 | Hughes et al. |
| 7,117,112 B2 | 10/2006 | Mok |
| 7,161,999 B2 | 1/2007 | Parikh |
| 7,165,003 B2 | 1/2007 | Mok |
| 7,187,741 B2 | 3/2007 | Pontius et al. |
| 7,203,616 B2 | 4/2007 | Mok |
| 7,239,650 B2 | 7/2007 | Rakib et al. |
| 7,239,669 B2 | 7/2007 | Cummings et al. |
| 7,295,945 B2 | 11/2007 | Mok |
| 7,388,160 B2 | 6/2008 | Mok et al. |
| 7,417,985 B1 | 8/2008 | McCrosky et al. |
| 7,468,974 B1 | 12/2008 | Carr et al. |
| 7,492,760 B1 | 2/2009 | Plante et al. |
| 7,593,411 B2 | 9/2009 | McCrosky et al. |
| 7,656,791 B1 | 2/2010 | Mok et al. |
| 7,668,210 B1 | 2/2010 | Mok et al. |
| 7,751,411 B2 | 7/2010 | Cam et al. |
| 7,772,898 B2 | 8/2010 | Cheung |
| 7,807,933 B2 | 10/2010 | Mok et al. |
| 8,010,355 B2 | 8/2011 | Rahbar |
| 8,023,641 B2 | 9/2011 | Rahbar |
| 8,085,764 B1 | 12/2011 | McCrosky et al. |
| 8,243,759 B2 | 8/2012 | Rahbar |
| 8,335,319 B2 | 12/2012 | Rahbar |
| 8,413,006 B2 | 4/2013 | Mok et al. |
| 8,428,203 B1 | 4/2013 | Zortea et al. |
| 8,483,244 B2 | 7/2013 | Rahbar |
| 8,542,708 B1 | 9/2013 | Mok et al. |
| 8,599,986 B2 | 12/2013 | Rahbar |
| 8,774,227 B2 | 7/2014 | Rahbar |
| 8,854,963 B1 | 10/2014 | Muma et al. |
| 8,913,688 B1 | 12/2014 | Jenkins |
| 8,957,711 B2 | 2/2015 | Jin et al. |
| 8,971,548 B2 | 3/2015 | Rahbar et al. |
| 8,976,816 B1 | 3/2015 | Mok et al. |
| 8,989,222 B1 | 3/2015 | Mok et al. |
| 9,019,997 B1 | 4/2015 | Mok et al. |
| 9,025,594 B1 | 5/2015 | Mok et al. |
| 9,209,965 B2 | 12/2015 | Rahbar et al. |
| 9,276,874 B1 | 3/2016 | Mok et al. |
| 9,313,563 B1 | 4/2016 | Mok et al. |
| 9,374,265 B1 | 6/2016 | Mok et al. |
| 9,444,474 B2 | 9/2016 | Rahbar et al. |
| 9,473,261 B1 | 10/2016 | Tse et al. |
| 9,503,254 B2 | 11/2016 | Rahbar et al. |
| 9,525,482 B1 | 12/2016 | Tse |
| 10,069,503 B2 | 9/2018 | Zhang et al. |
| 10,104,047 B2 | 10/2018 | Muma et al. |
| 10,128,826 B2 | 11/2018 | Jin et al. |
| 10,250,379 B2 | 4/2019 | Haddad et al. |
| 10,432,553 B2 | 10/2019 | Tse |
| 10,608,647 B1 * | 3/2020 | Ranganathan ........ H03L 7/0814 |
| 10,715,307 B1 | 7/2020 | Jin |
| 2001/0056512 A1 | 12/2001 | Mok et al. |
| 2005/0110524 A1 | 5/2005 | Glasser |
| 2006/0056560 A1 | 3/2006 | Aweya et al. |
| 2006/0076988 A1 | 4/2006 | Kessels et al. |
| 2007/0036173 A1 | 2/2007 | McCrosky et al. |
| 2007/0064834 A1 | 3/2007 | Yoshizawa |
| 2007/0132259 A1 | 6/2007 | Ivannikov et al. |
| 2008/0000176 A1 | 1/2008 | Mandelzys et al. |
| 2008/0202805 A1 | 8/2008 | Mok et al. |
| 2010/0052797 A1 | 3/2010 | Carley et al. |
| 2011/0095830 A1 | 4/2011 | Tsangaropoulos et al. |
| 2014/0055179 A1 | 2/2014 | Gong et al. |
| 2014/0139275 A1 | 5/2014 | Dally et al. |
| 2016/0277030 A1 | 9/2016 | Burbano et al. |
| 2016/0301669 A1 | 10/2016 | Muma et al. |
| 2017/0244648 A1 | 8/2017 | Tse |
| 2018/0131378 A1 | 5/2018 | Haroun et al. |
| 2018/0159541 A1 * | 6/2018 | Spijker ................. H04J 3/0697 |

OTHER PUBLICATIONS

Abdo Ahmad et al: "Low-Power Circuit for Measuring and Compensating Phase Interpolator Non-Linearity", 2019 IEEE 10th Annual Information Technology, Electronics and Mobile Communication Conference (IEMCON), IEEE, Oct. 17, 2019 (Oct. 17, 2019), pp. 310-313.

PCT/CA2020/000068, International Search Report, Canadian Intellectual Property Office, dated Sep. 18, 2020.

* cited by examiner

FIG. 3

| Superframe Order | Superframe Sub-Field | Length | Bit Position(s) |
|---|---|---|---|
| Frame1, Sub-Frame 1 | Non-Phase Word | 2 | [0:1] |
| Frame1, Sub-Frame 1 | Second (e.g., PTP) Phase Word | 12 | [2:13] |
| Frame1, Sub-Frame 1 | First (e.g.,SyncE) Phase Word | 12 | [14:25] |
| Frame1, Sub-Frame 2 | Non-Phase Word | 3 | [26:28] |
| Frame1, Sub-Frame 2 | Second (e.g., PTP) Phase Word | 12 | [29:40] |
| Frame1, Sub-Frame 2 | First (e.g.,SyncE) Phase Word | 12 | [41:52] |
| Frame1, Sub-Frame 3 | Non-Phase Word | 3 | [53:55] |
| Frame1, Sub-Frame 3 | Second (e.g., PTP) Phase Word | 12 | [56:67] |
| Frame1, Sub-Frame 3 | First (e.g.,SyncE) Phase Word | 12 | [68:79] |

FIG. 4

Non-Phase Word Data

| Field | Notes | Range | Source | Length | Bit Position(s) |
|---|---|---|---|---|---|
| Start | Start of Superframe | | PLL | 2 | [0:1] |
| ToD Time (s) | Seconds | | PLL | 48 | [2:49] |
| ToD Time (ns) | Nanoseconds | 999,999,999 ns | PLL | 32 | [50:81] |
| ToD Time (ps) | Picoseconds | 999 ps | PLL | 16 | [82:97] |
| PTP Freq. Offset | Parts Per Trillion | 1953 ppm | PLL | 32 | [98:129] |
| SyncE Freq. Offset | Parts Per Trillion | 1953 ppm | PLL | 32 | [130:161] |
| Messaging Channel | User Specific | | User | 30 | [162:191] |
| CRC | x8+x5+x4+1 | | PLL | 8 | [192:199] |

Non-Phase Word Data

| Field | Sub-Field | Comments | Range | Source | Length | Bit Position(s) |
|---|---|---|---|---|---|---|
| Start | | Start of Frame | N/A | PLL | 2 | [0:1] |
| ToD Time (s) | | Seconds | Large | PLL | 48 | [2:49] |
| ToD Time (ns) | | Nanoseconds | 999,999,999 ns | PLL | 32 | [50:81] |
| ToD Time (ps) | | Picoseconds | 999 ps | PLL | 16 | [82:97] |
| PTP Freq. Offset | | Parts Per Trillion | 1953 ppm | PLL | 32 | [98:129] |
| SyncE Freq. Offset | | Parts Per Trillion | 1953 ppm | PLL | 32 | [130:161] |
| Messaging Channel | Byte 0 Bit 7 | Reserved | | User | 1 | [162] |
| Messaging Channel | Byte 0 Bit 6 | PTP Step Time Pending | | User | 1 | [163] |
| Messaging Channel | Byte 0 Bit 5 | PTP Set Time Pending | | User | 1 | [164] |
| Messaging Channel | Byte 0 Bit 4 | PTP Time Set | | User | 1 | [165] |
| Messaging Channel | Byte 0 Bit 3 | PTP Locked | | User | 1 | [166] |
| Messaging Channel | Byte 0 Bit 2 | SyncE Signal Fail | | User | 1 | [167] |
| Messaging Channel | Byte 0 Bit 1 | SyncE Locked | | User | 1 | [168] |
| Messaging Channel | Byte 0 Bit 0 | CRC Valid (Transmitter) | | User | 1 | [169] |
| Messaging Channel | Byte 1 Bits [7:0] | User Specified | | User | 8 | [170:177] |
| Messaging Channel | Byte 2 Bits [7:0] | User Specified | | User | 8 | [178:185] |
| Messaging Channel | Byte 3 Bits [5:0] | User Specified | | User | 6 | [186:191] |
| CRC | | x8+x5+x4+1 | | PLL | 8 | [192:199] |

FIG. 5

CIRCUITS AND METHODS FOR TRANSFERRING TWO DIFFERENTIALLY ENCODED CLIENT CLOCK DOMAINS OVER A THIRD CARRIER CLOCK DOMAIN BETWEEN INTEGRATED CIRCUITS

The present invention relates to integrated circuit systems operating with multiple clock domains. More particularly, the present invention relates to circuits and methods for transferring two differentially encoded client clock domains over a third carrier clock domain between integrated circuits.

BACKGROUND

In existing equipment implementations, a backplane or midplane carries timing between two separate boards using one physical pin. With existing PLL implementations, one physical wire can carry only frequency/phase/time information for one clock domain. There sometimes exists a need to carry frequency/phase/time information for two independent clock domains over one physical wire; for example, those of a SyncE clock domain and a PTP clock domain. An easy solution would be to increase the number of wires from one to two, but this is not always possible, due to existing deployment and backwards compatibility of equipment design.

Existing solutions include an 8A34003 system synchronizer integrated circuit available from Integrated Device Technology, Inc, of San Jose, Calif. This implementation has an input-output signal format that combines frequency/phase/time information for two clock domains, using the clock signal of one clock domain as the carrier and the other as the client. The 8A34003 signal format does not support a third clock domain. One weakness of this existing solution is that by requiring one of the two clock signals to be the carrier of the other signal as a client it introduces undesired effects including that: the carrier may disappear (if the input to the equipment is disconnected); the carrier may change source dynamically; the carrier may have transients or be unstable; and the carrier may have a large frequency offset from the client. All of these undesired effects lead to performance degradation of the client and can lead to system noise generation and noise transfer performance that does not meet system requirements.

BRIEF DESCRIPTION

In accordance with an aspect of the invention, A method for transferring, via a carrier clock signal in a carrier clock domain, a first client clock signal in a first client clock domain and a second client clock signal in a second client clock domain between a first and a second integrated circuit includes providing a stable reference clock source to the first integrated circuit, generating, in the first integrated circuit, the carrier clock signal from the stable reference clock source and phase locking the generated carrier clock signal to the stable reference clock source, providing a first client clock signal in the first client clock domain to the first integrated circuit, phase locking a first client clock signal DPLL to the first client clock signal, providing a second client clock signal in the second client clock domain to the first integrated circuit, phase locking a second client clock signal DPLL to the second client clock signal, latching a present phase of the first client clock signal and encoding a phase change of the first client clock signal since a last latched phase of the first client clock signal as first phase word information in first bit positions, latching a present phase of the second client clock signal and encoding a phase change of the second client clock signal since a last latched phase of the second client clock signal as second phase word information in second bit positions different from the first bit positions, and modulating the carrier signal to generate and send first and second phase word information and non-phase word information over a single wire in designated sub-frame slots from the first integrated circuit to the second integrated circuit.

In accordance with an aspect of the invention, generating and phase locking the carrier clock signal in the first integrated circuit includes generating the carrier clock signal in a carrier clock signal phase-locked loop in the first integrated circuit, providing the first client clock signal to the first integrated circuit includes providing the first client clock signal to a first client clock signal phase-locked loop in the first integrated circuit, and providing the second client clock signal to the first integrated circuit includes providing the second client clock signal to a second client clock signal phase-locked loop in the first integrated circuit.

In accordance with an aspect of the invention, encoding the phase change of the first and second client clock signals onto the carrier clock signal includes encoding a plurality of bits representing the changes in phases of the first and second client clock signals by modulating timing of an edge of the carrier clock signal thereby varying the duty cycle of the carrier clock signal to represent the value of each bit.

In accordance with an aspect of the invention, modulating the timing of an edge of the carrier clock signal thereby varying the duty cycle of the carrier clock signal includes modulating the timing of a falling edge of the carrier clock signal.

In accordance with an aspect of the invention, modulating the timing of the falling edge of the carrier clock signal includes setting the timing of the falling edge of the carrier clock signal to create a duty cycle of less than 50% to represent a first digital bit value and setting the timing of the falling edge of the carrier clock signal to create a duty cycle of 50% to represent a second digital bit value.

In accordance with an aspect of the invention, the method further includes setting the timing of the falling edge of the carrier clock signal to create a duty cycle of more than 50% to represent a marker bit.

In accordance with an aspect of the invention, encoding the phase change of the first client clock signal in first bit positions includes encoding the phase change of the first client clock signal in a first phase word, and encoding the phase change of the second client clock signal in second bit positions different from the first bit positions includes encoding the phase change of the second client clock signal in a second phase word.

In accordance with an aspect of the invention, the method further includes encoding time of day (ToD) information from a ToD counter onto the carrier clock signal in third bit positions different from the first and second bit positions.

In accordance with an aspect of the invention, encoding time of day (ToD) information onto the carrier clock signal in third bit positions includes encoding time of day (ToD) information as first non-phase word information.

In accordance with an aspect of the invention, the method further includes encoding data from a messaging channel onto the carrier clock signal in fourth bit positions different from the first and second bit positions and the first non-phase word information in the third bit position.

In accordance with an aspect of the invention, encoding data from the messaging channel onto the carrier clock signal in fourth bit positions includes encoding data from the messaging channel as second non-phase word information.

In accordance with an aspect of the invention, the method further includes receiving in the second integrated circuit the modulated carrier clock signal from the first integrated circuit over the single wire, decoding the phase change of the first client clock signal with respect to the carrier clock signal from the modulated carrier clock signal, providing the decoded phase change of the first client clock signal to a first client clock signal phase-locked loop, decoding the phase change of the second client clock signal with respect to the carrier clock signal from the modulated carrier clock signal, providing the decoded phase change of the second client clock signal to a second client clock signal phase-locked loop, and providing the carrier clock signal received in the second integrated circuit to a carrier clock signal phase-locked loop.

In accordance with an aspect of the invention, a system for transferring between a first and a second integrated circuit, over a carrier clock signal, a first client clock signal and a second client clock signal includes the first integrated circuit coupled to the second integrated circuit, a carrier clock signal phase-locked loop in the first integrated circuit having an input coupled to a reference frequency source of a carrier clock domain, a first client clock signal phase-locked loop in the first integrated circuit having an input coupled to the first client clock signal, a second client clock signal phase-locked loop in the first integrated circuit having an input coupled to the second client clock signal, an encoder circuit in the first integrated circuit configured to encode information regarding a phase change of the first client clock signal with respect to the carrier clock signal onto the carrier clock signal in first bit positions, encode information regarding a phase change of the second client clock signal with respect to the carrier clock signal onto the carrier clock signal in second bit positions different from the first bit positions, and transmit the carrier clock signal with the encoded information regarding the phase change of the first and second client clock signals over a single communication wire from the first integrated circuit to the second integrated circuit.

In accordance with an aspect of the invention, the encoder circuit is further configured to encode ToD information onto the carrier clock signal, and encode data from a messaging channel onto the carrier clock signal.

In accordance with an aspect of the invention, the system further includes a decoder circuit in the second integrated circuit configured to receive in the second integrated circuit the carrier clock signal with the encoded information regarding the phase change of the first and second client clock signals from the first integrated circuit over the single communication wire, decode the phase change information of the first client clock signal from the carrier clock signal, and decode the phase change information of the second client clock signal from the carrier clock signal, and the system further includes a carrier clock signal phase-locked loop in the second integrated circuit having an input coupled to the decoder circuit to receive the carrier clock signal, a first client clock signal phase-locked loop having an input coupled to the decoder to receive the decoded phase change information of the first client clock signal, and a second client clock signal phase-locked loop having an input coupled to the decoder to receive the decoded phase change information of the second client clock signal.

In accordance with an aspect of the invention, the decoder is further configured to decode the ToD information from the carrier clock signal, and decode the data from the messaging channel from the carrier clock signal.

BRIEF DESCRIPTION OF THE DRAWING FIGURES

The invention will be explained in more detail in the following with reference to embodiments and to the drawing in which are shown:

FIG. 3 is a chart showing a possible arrangement of an illustrative information frame order for passing the phase of the first clock domain, the phase of the second clock domain, and non-phase information including ToD and messaging channel between integrated circuits in accordance with an aspect of the invention;

FIG. 4 is a chart showing an exemplary arrangement of the 200 bits of non-phase-word data in the sub-frames of FIG. 3;

FIG. 5 is a chart showing a possible arrangement of the 200 bits of non-phase-word data in FIG. 4, showing a non-limiting example of how the 30 bits of user data may be arranged in a messaging channel in accordance with an aspect of the invention;

Figure 6:
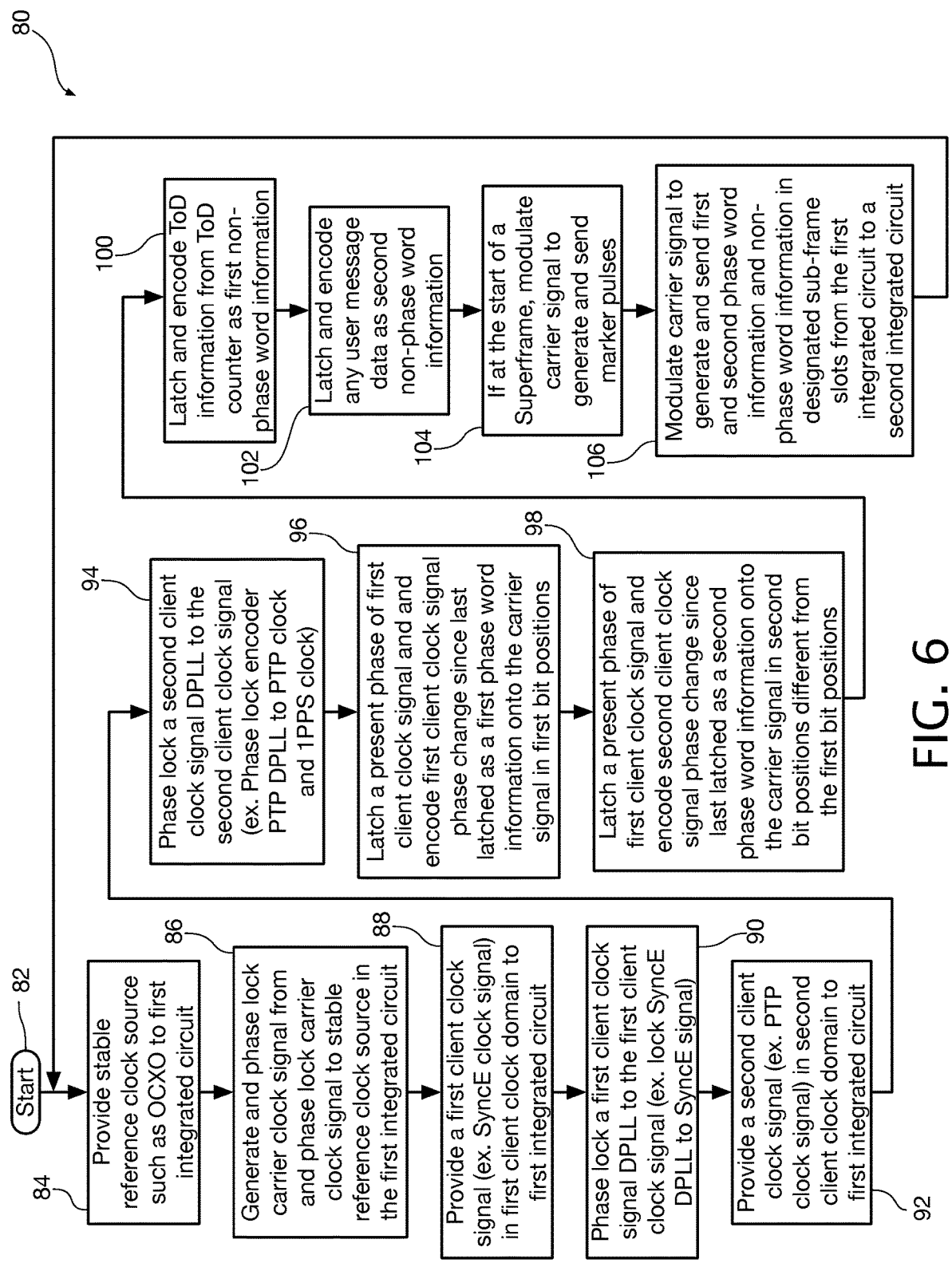
Figure 7:
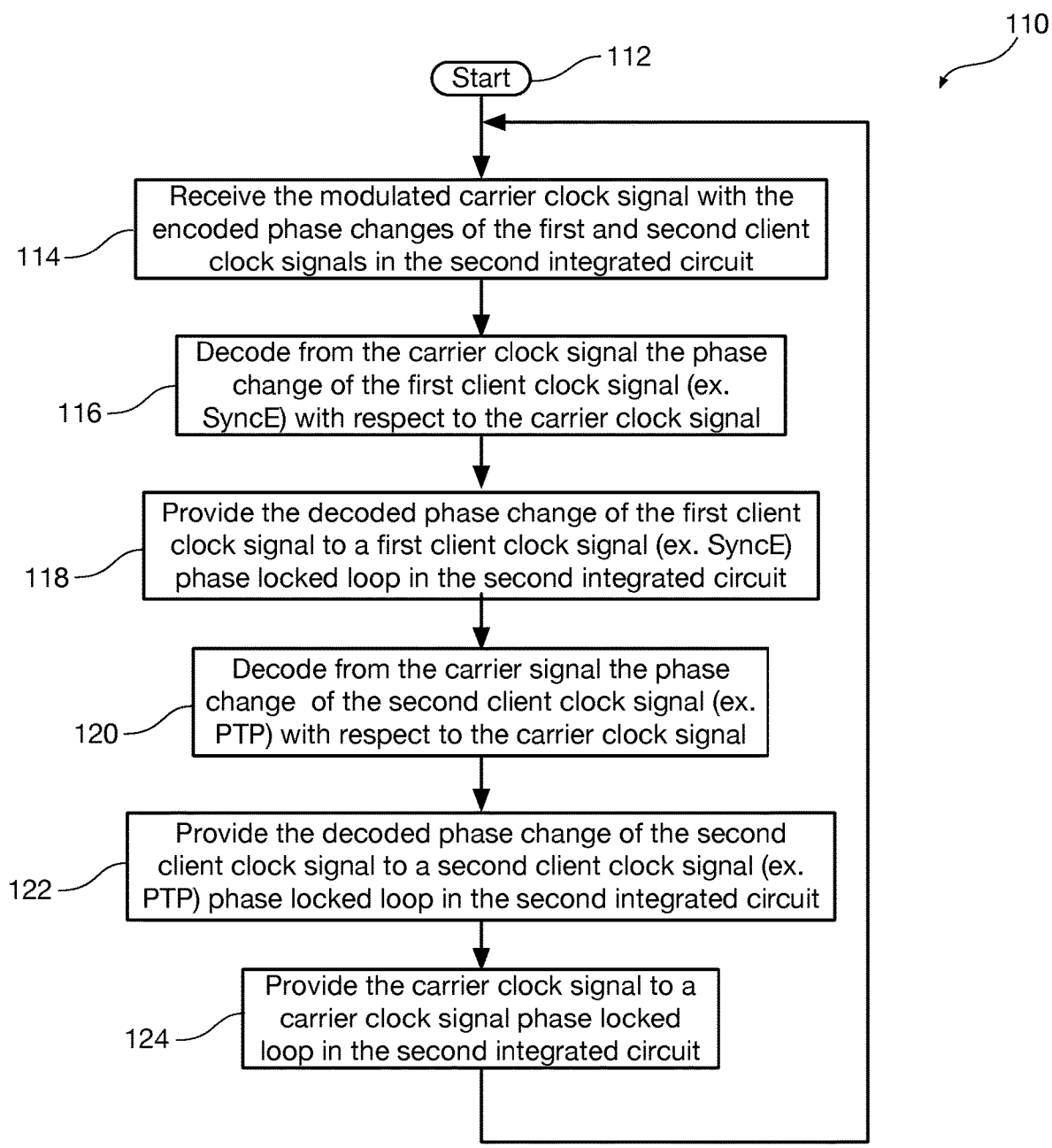

FIG. 6 is a flow diagram showing an illustrative method for encoding and sending data from a first encoded client clock domain and a second encoded client clock domain over a carrier clock domain between a first integrated circuit and a second integrated circuit s in accordance with an aspect of the invention; and FIG. 7 is a flow diagram showing an illustrative method for decoding data in the second integrated circuit in accordance with an aspect of the invention.

DETAILED DESCRIPTION

Persons of ordinary skill in the art will realize that the following description is illustrative only and not in any way limiting. Other embodiments will readily suggest themselves to such skilled persons.

According to one illustrative embodiment of the present invention an interface is provided that can convey information such as but not limited to OCXO frequency, Synchronous Ethernet (SyncE) frequency and PTP frequency, phase, and time-of-day (ToD) on a single wire. The present invention can be used to convey other information. The interface is designed to minimize PCB traces while meeting all requirements for chip-to-chip and board-to-board timing connections in next-generation WAN networking equipment.

The present invention is useful in systems employing three clock domains. The carrier clock signal is sourced from a stable source (e.g. a local oven-controlled crystal oscillator). The carrier clock signal is used as a baseline reference for first and second client clock signals of respective first and second client clock domains. The carrier clock signal is also used as the master clock for both an encoder and a decoder. Relative information regarding first and second client clock signals is encoded over the carrier clock signal by modulating an attribute of the carrier clock signal such as the amplitude, or the timing (location) of either the falling edge or the rising edge of the carrier clock signal to transfer encoded information about the first and second client clock signals.

In one illustrative embodiment of the present invention, the modulation allows each carrier clock signal cycle to encode a logic 0 (if the falling, or rising, edge is sooner than expected creating, for example, a 25/75 duty cycle), 1 (if the falling, or rising, edge is at normal location creating a 50/50 duty cycle), or a Marker (if the falling, or rising, edge is later than expected creating, for example, a 75/25 duty cycle). Persons of ordinary skill in the art will readily observe that the relative timings or other attributes assigned to encode the logic 0, logic 1, and marker designations in accordance with the present invention are arbitrary and selection of which to assign is largely a matter of design choice.

The encoded information is a plurality of bits that represents phase change of the first client clock signal since the last time it was recorded. Phase change information regarding the second client clock signal is encoded in the same manner as the phase change information of the first client clock signal.

The present invention provides the ability to transfer information regarding, among other things, frequency/phase/time information from multiple client clock domains over a single physical wire. This reduces the number of wires/traces required in the application, such as between integrated circuits over a backplane in a modular chassis system or between integrated circuits on a circuit board. The term clock domain refers to a set of clock signals that are frequency-locked and optionally phase-locked together by PLLs. Thus, clock signals in a clock domain are not necessarily of the same nominal frequency, but, because they are frequency-locked and optionally phase-locked together by PLLs, all the signals have the same frequency offset, as defined below.

Figure 1:
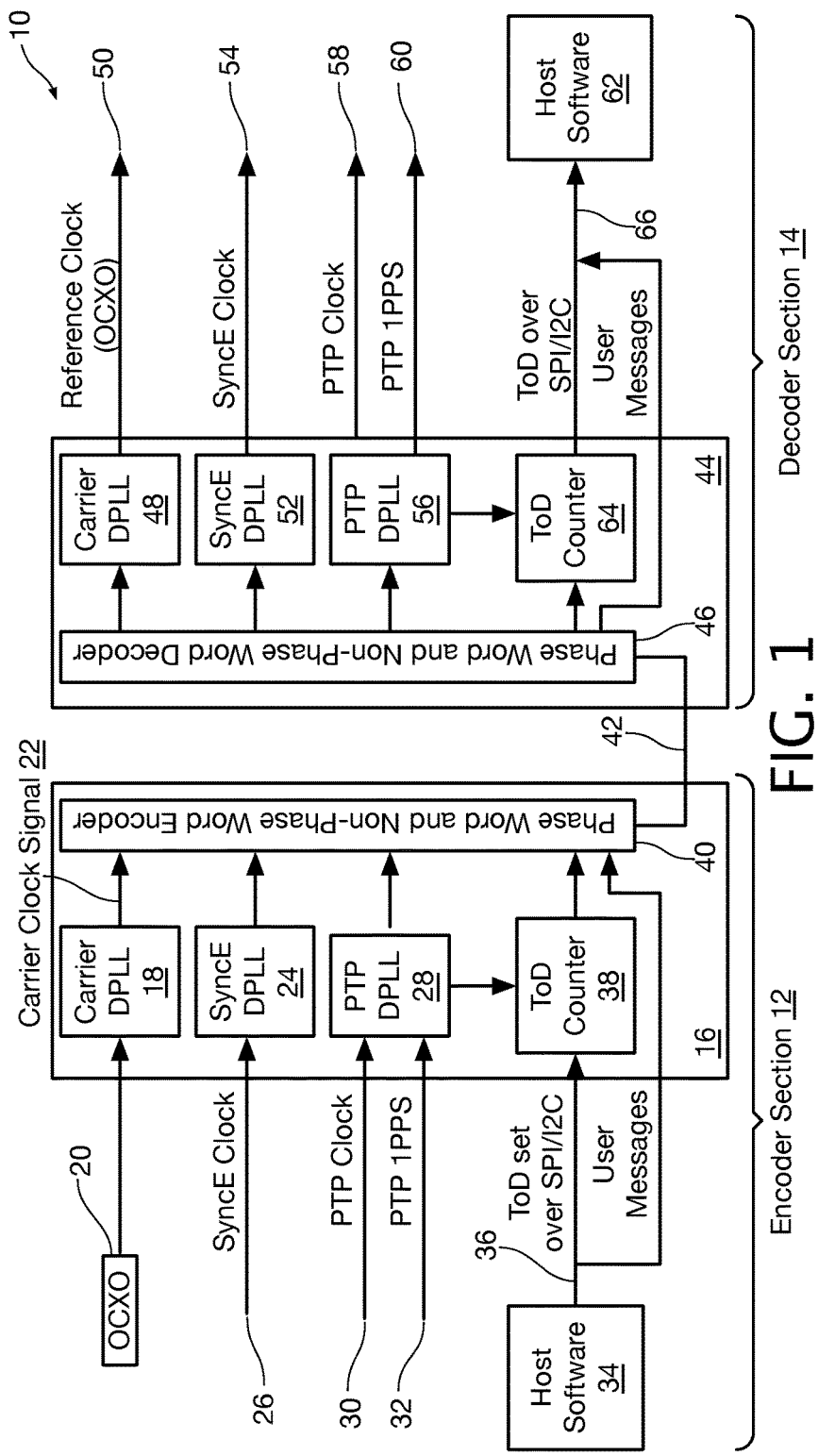
FIG. 1 is a simplified block diagram of an integrated circuit system including two integrated circuits to show an illustrative method for transferring clock signals between two differentially encoded client clock domains over a carrier clock domain between integrated circuits in accordance with an aspect of the invention.

Referring first of all to FIG. 1, a simplified block diagram shows a system 10 including two integrated circuits to show an illustrative method for transferring frequency/phase/time information regarding clock signals from two client clock domains over a carrier clock domain between the respective integrated circuits in accordance with an aspect of the invention.

The system 10 of the present invention includes two parts, an encoder section indicated in brackets 12 and a decoder section shown in brackets 14.

A first integrated circuit 16 located in the encoder section 12 includes a carrier digital phase-locked loop (DPLL) 18, locked to a stable reference clock source such as the output clock signal of an oven-controlled crystal oscillator OCXO 20 to generate a carrier clock signal 22 at its output.

A SyncE DPLL 24 is locked to a first client clock signal such as a SyncE clock signal 26 and a PTP DPLL 28 is locked to a second client clock signal such as from a PTP slave represented by a PTP clock signal 30. A 1 pulse-per-second (PPS) signal, which in an exemplary embodiment is received from a GPS receiver, is input over line 32. GPS is illustrated as a non-limiting embodiment of a global navigation satellite system (GNSS), and a timing input from any GNSS is particularly contemplated, although other sources are possible. Host software 34 sends a time-of-day (ToD) set signal and user messages over a bus such as SPI/I2C 36. The ToD set signal is sent to a ToD counter 38.

A phase word and non-phase word encoder 40 latches or records at periodic intervals non-phase word information including information such as ToD information obtained from the ToD counter 38, the frequency offset between the carrier clock signal 22 and the SyncE signal from the DPLL 24, the frequency offset between the carrier clock signal 22 and the PTP signal from the PTP DPLL 28, and user message contents sent from the host software 34. The frequency offset information is expressed in parts per trillion and may be obtained, for illustration, by counting the actual number of cycles of SyncE clock signal 26 (or cycles of PTP clock signal 30) per some number of cycles of carrier clock signal 22, and comparing it with a nominal number of SyncE clock cycles (or PTP clock cycles) per that number of carrier clock cycles. If there is no variance, the offset is zero, and if there is a variance, the offset can be stated in parts per trillion. As an example, the number of 25 MHz SyncE clock cycles that occur during 2,000 2 kHz carrier clock cycles should be 25 million. If the actual number is 25,000,006 the variance is +6/25,000,000. If the actual number is 24,999,994 the variance is −6/25,000,000. Both can be expressed in parts per trillion (ppt), or parts per million (ppm). In accordance with one illustrative embodiment of the invention, as shown in FIG. 4 and FIG. 5, the maximum value this field can hold is 1953 ppm, i.e., 1,953,000,000 ppt.

The phase word and non-phase word encoder 40 also latches or records, and determines, at periodic intervals phase word information including the difference between the current phase ($\phi$) of the SyncE clock signal output from the DPLL 24 and the phase of the SyncE clock signal output from the DPLL 24 that was last latched by phase word and non-phase word encoder 40, and the difference between the current phase ($\phi$) of the output clock signal from the PTP DPLL 28 and the phase of the output PTP clock signal from the PTP DPLL 28 that was last latched by phase word and non-phase word encoder 40. The phase word and non-phase word encoder 40 then encodes all of this information as a plurality of individual bits in a format created by modulating the carrier clock signal, in one embodiment modulating the pulse width of the falling (or rising) edge of the carrier clock signal, as shall be seen herein. The encoded information is sent over a single wire 42 in accordance with an aspect of the invention.

A second integrated circuit 44 in the decoder section 14 includes a phase word and non-phase word decoder 46 that decodes the non-phase word and phase word information that was encoded in the phase word and non-phase word encoder 40 in the integrated circuit 16.

A carrier DPLL 48 generates a reference clock signal on line 50 that is frequency-locked to the output clock signal of oven-controlled crystal oscillator OCXO 20 in the encoder section by virtue of it being phase locked to the carrier clock signal 22. In the example embodiment of FIG. 1, the output frequency of the DPLL 48 is shown being the same as that of the output of OCXO 20, but persons of ordinary skill in the art will appreciate that the output frequency of the DPLL 48 does not have to be the same as the nominal frequency of the output of the OCXO 20 and can be whatever nominal frequency is most useful on the decoder side. The carrier DPLL 48 in the decoder section 14 synchronizes/locks to the carrier clock signal 22 received from the encoder section 12 ensuring that the decoder section 14 shares the same phase/time reference as the encoder section 12. This is valuable as the information carried regarding client clock signals over the carrier is with respect to the carrier clock signal 22.

A SyncE DPLL 52 drives a SyncE clock signal 54 and a PTP DPLL 56 drives a PTP clock signal 58. A PTP 1 PPS signal is driven out over line 60. Host software 62 running in the decoder section 14 can read the received ToD information from a ToD counter 64 that received it from the phase word and non-phase word decoder 46. The ToD counter 64 communicates with the host software 62 over a bus such as SPI/I2C 66. The user messages are also provided to the host software 62 from the phase word and non-phase word decoder 46 over the bus 66.

As can be seen from the above description, the integrated circuit system 10 of FIG. 1 utilizes three clock signals, each associated with a respective clock domain. The carrier clock signal 22 sourced from a stable source (the oven-controlled local oscillator OCXO 20) is used as a baseline reference for the phase word and non-phase word encoder 40 in the first integrated circuit 16 to encode the two client clock signals.

The carrier clock signal 22 is also used as the master clock stabilization source for the SyncE DPLL 52, which generates the SyncE clock output signal on line 54. The SyncE DPLL 52 synchronizes/locks to the SyncE clock signal 26 that is encoded over the carrier clock signal 22, by using the combination of the phase word information encoded in the channel (i.e. through the modulation scheme presented earlier) and the phase of the carrier DPLL 48. The PTP DPLL 56 synchronizes/locks to the PTP clock signal 30 by using the combination of the phase word information encoded through the modulation scheme presented earlier and the phase of the carrier DPLL 48. The PTP DPLL 56 outputs the PTP clock signal on line 58 and the PTP 1 PPS signal on line 60. Host software 62 running in the decoder section 14 receives the ToD information and user messages over bus 66.

Figure 2:
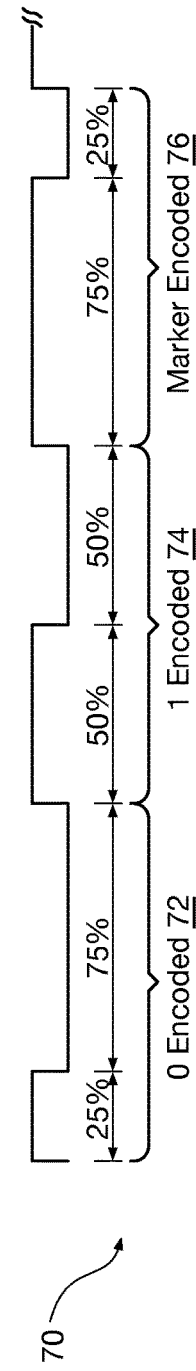
FIG. 2 is a diagram of a waveform showing an illustrative encoding method for transmitting data in a carrier clock domain.

Referring now to FIG. 2, a waveform diagram indicated at reference numeral 70 shows one way that information can be encoded over the carrier clock signal 22 by modulating the falling edge location of the carrier clock signal 22. In accordance with an illustrative embodiment of the present invention, the modulation allows each carrier clock signal cycle (falling edge) to encode a logic 0 if the falling edge is sooner than expected creating a 25/75 duty cycle as shown at reference numeral 72, a logic 1 if the falling edge is at normal location creating a 50/50 duty cycle as shown at reference numeral 74, or a Marker if the falling edge is later than expected creating a 75/25 duty cycle as shown at reference numeral 76. Persons of ordinary skill in the art will appreciate that duty cycles defining the identities of the 0 logic state, the 1 logic state, and the Marker are arbitrary and that the 25/75 duty cycle, the 50/50 duty cycle, and the 75/25 duty cycle could be used to represent other combinations of the 0 logic state, the 1 logic state, and the Marker.

The encoded information represents both phase word information and non-phase word information as described above, and is thus transferred as a duty cycle modulation of carrier clock signal 22 between first integrated circuit 16 and second integrated circuit 44.

In one illustrative embodiment of the invention, the carrier clock signal 22 is a 2 kHz clock signal frequency-locked to the OCXO 20. The OCXO 20 is typically thousands of time higher in frequency than the carrier clock signal 22.

The carrier DPLL 18 in the encoder section 12 can lock to the OCXO 20 and thereby have the same long-term frequency accuracy as the OCXO 20. A 2 kHz carrier clock signal 22 is generated by carrier DPLL 18 that is frequency-locked to its local OCXO 20. In one example embodiment of the invention, once every 2,000 carrier cycles the phase word and non-phase word encoder 40 generates a superframe starting with two 75% duty cycle pulses that indicate the start of the superframe. It is to be understood that the use of a 2 kHz carrier clock signal, and the use of a superframe once every 2,000 carrier cycles is not meant to be limiting in any way, and other values for both the carrier clock signal frequency 22 and the number of bits in a superframe may be utilized without exceeding the scope.

The phase word and non-phase word encoder 40 saves the exact PTP-domain ToD of the rising edge of the first marker pulse of each superframe. It then inserts this ToD into the superframe into non-phase-word bits as enumerated in FIG. 4 and FIG. 5.

Periodically, in an exemplary embodiment 75 times each second, the phase word and non-phase word encoder 40 latches the present phase information of PTP and SyncE DPLL 28, 24, respectively, and determines the phase change since the last phase information was latched. It inserts these phase changes into the predefined slots in the superframe data, particularly the slots for PTP phase-word and SyncE phase-word fields of each subframe.

In an exemplary embodiment the rising edges of the carrier clock signal 22 are equally spaced in time and are low-jitter, while the falling edges of the carrier clock signal 22 are modulated to convey data as described herein. In one embodiment of the invention, this data is a continuous stream of 2,000-bit superframes, with a superframe rate of 1 Hz. In an exemplary embodiment each superframe contains 200 bits of non-phase-word data, 900 bits of PTP phase-word data, and 900 bits of SyncE phase-word data.

In an embodiment of the invention the 2,000-bit superframe is comprised of 25 frames (80 bits per frame). As depicted in FIG. 3, in this embodiment each frame may be comprised of 3 sub-frames of 26, 27 and 27 bits, respectively, for a total of 75 sub-frames per superframe. The beginning of the first sub-frame in the superframe is identified using 2 marker bits.

Persons of ordinary skill in the art will note that with 75 sub-frames per superframe (i.e., 75 sub-frames per second) the decoder section 14 receives both SyncE phase updates and PTP phase updates at a 75 Hz rate. The SyncE DPLL 52 and the PTP DPLL 56 in the decoder section 14 can lock to these streams of phase updates in much the same manner that they would lock to a 75 Hz clock signal.

In an exemplary embodiment of the invention, the 200 bits of non-phase-word data may be arranged as depicted in FIG. 4. The bit fields shown in FIG. 3 are repeated 25 times in a superframe. In addition, FIG. 5 is a chart showing a possible arrangement of the 200 bits of non-phase-word data in FIG. 4, showing a non-limiting example of how 30 bits of user data may be arranged in a messaging channel in accordance with an aspect of the invention.

The phase word and non-phase word decoder 46 receives the 2 kHz carrier clock signal and finds superframe alignment by watching for two sequential Marker pulses.

The phase word and non-phase word decoder 46 adjusts time of day in the ToD counter 64 once each second using the incoming ToD time bits in the non-phase word information shown in the table of FIG. 4. The decoder section 14 also phase-locks its output PTP clock signal 58 and output PTP 1 PPS signal 60 responsive to the incoming stream of PTP phase-words and phase-locks its output SyncE clock signal 54 responsive to the incoming stream of SyncE phase-words.

If the carrier clock signal 22 that the decoder section 14 is tracking fails activity monitoring or frequency monitoring, the decoder section 14 can switch to a secondary signal (e.g., another instance of wire 42, not shown) or to holdover if no secondary signal is available.

Referring now to FIG. 6, a flow diagram shows an illustrative method 80 for encoding data in the encoder section 12 in accordance with an aspect of the invention. The method begins at reference numeral 82.

At reference numeral 84, a stable reference clock source such as an OCXO is provided to the first integrated circuit. At reference numeral 86 a carrier clock signal is generated from, and phase locked to, the stable reference clock source, in the first integrated circuit. At reference numeral 88, a first client clock signal, for example a SyncE client clock signal, in a first client clock domain, is provided to the first integrated circuit. At reference numeral 90, the first client clock signal DPLL is phase locked to the first client clock signal, for example the SyncE DPLL 24 in the encoder section 12 is phase locked to SyncE signal 26. At reference numeral 92, a second client clock signal, for example a PTP client clock signal, in a second client clock domain, is provided to the first integrated circuit. At reference numeral 94, the second client clock signal DPLL is phase locked, for example the PTP DPLL 28 is phase locked to PTP clock 30 and PTP 1 PPS 32.

At reference numeral 96, the first client clock phase is latched and the phase change (e.g., the SyncE clock signal phase) since the last time it was latched/recorded is determined and encoded as phase word information in first bit positions in the phase word and non-phase word encoder 40. At reference numeral 98, the second client clock signal phase is latched and the phase change (e.g., the PTP clock signal phase) since the last time it was latched/recorded is determined and encoded as phase word information in second bit positions in the phase word and non-phase word encoder 40. At reference numeral 100, ToD information received from ToD counter 38 is latched and encoded as non-phase word information. At reference numeral 102, any received user message data is latched and encoded as non-phase word information in the phase word and non-phase word encoder 40.

At reference numeral 104, preferably the carrier clock signal is modulated to send marker pulses. At reference numeral 106, the carrier clock signal is modulated to send the encoded first client clock signal frequency and phase difference values, the second client clock signal frequency and phase difference values, ToD, and user message data in designated sub-frame slots. The method then returns to reference numeral 96 where the sequence performed by reference numerals 96 through 106 is repeated.

Referring now to FIG. 7, a flow diagram shows an illustrative method 110 for decoding data in the decoder section 14 in the second integrated circuit in accordance with an aspect of the invention. The method begins at reference numeral 112.

At reference numeral 114, the modulated carrier clock signal 22 with the encoded phase change of the first client clock signal, for example the SyncE clock signal 26, and the second client clock signal, for example the PTP clock signal 30, is received in the decoder section 14 from the encoder section 12 over a single wire, such as wire 42.

At reference numeral 116, the phase change of the first client clock signal, for example the SyncE clock signal 26 is decoded from the carrier clock signal 22. At reference numeral 118, the decoded phase change of the first client clock signal is provided to the first client (e.g., SyncE) DPLL 52 in the second integrated circuit 44 of the decoder section 14.

At reference numeral 120, the phase change of the second client clock signal, for example the PTP clock signal 30, is decoded from the carrier clock signal 22. At reference numeral 122, the decoded phase change of the second client clock signal is provided to the second client (e.g., PTP) DPLL 56 in the second integrated circuit 44 of the decoder section 14. At reference numeral 124, the carrier clock signal 22 received in the decoder section 14 is provided to the carrier DPLL 48 in the second integrated circuit 44 of the decoder section 14. The method then returns to reference numeral 114 where the sequence performed by reference numerals 114 through 124 is repeated.

The present invention provides several advantages. First, it supports multiple clock signal information carried over a single physical pin/wire/trace.

Second, preferably the clock signals are encoded with respect to a known, stable local reference (for example, an oven-controlled crystal oscillator (OCXO 20). This avoids the first and second clock signals being degraded by instability of the carrier clock signal. In prior-art solutions the carrier clock signal is derived from external (unknown) sources that are subject to frequency offsets, phase transients and may be switched between different sources.

Third, the OCXO signal is a stable local reference that is the master oscillator for both the encoder section 12 and the decoder section 14. This avoids having to instantiate a master oscillator in each of the encoder 12 and decoder 14.

Fourth, the client clock signals are differentially encoded in relation to the carrier clock signal in order to compress the information and keep the speed of the interface to a very slow rate, e.g., 2 kbps.

The present invention allows for full compliance with major Telecom specifications, such as ITU-T G.8262, G.8262.1, G.8273.2 and G.8273.4.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for transferring, via a carrier clock signal in a carrier clock domain, a first client clock signal in a first client clock domain and a second client clock signal in a second client clock domain between a first and a second integrated circuit, comprising:
   providing a stable reference clock source to the first integrated circuit;
   generating, in the first integrated circuit, the carrier clock signal from the stable reference clock source and phase locking the generated carrier clock signal to the stable reference clock source;
   providing a first client clock signal in the first client clock domain to the first integrated circuit;
   phase locking a first client clock signal DPLL to the first client clock signal;
   providing a second client clock signal in the second client clock domain to the first integrated circuit;
   phase locking a second client clock signal DPLL to the second client clock signal;
   latching a present phase of the first client clock signal and encoding a phase change of the first client clock signal since a last latched phase of the first client clock signal as first phase word information in first bit positions;
   latching a present phase of the second client clock signal and encoding a phase change of the second client clock signal since a last latched phase of the second client clock signal as second phase word information in second bit positions different from the first bit positions; and
   modulating the carrier clock signal to generate and send first and second phase word information and non-phase word information over a single wire in designated sub-frame slots from the first integrated circuit to the second integrated circuit.

2. The method of claim 1 wherein:
generating and phase locking the carrier clock signal in the first integrated circuit comprises generating the carrier clock signal in a carrier clock signal phase-locked loop in the first integrated circuit;
providing the first client clock signal to the first integrated circuit comprises providing the first client clock signal to a first client clock signal phase-locked loop in the first integrated circuit; and
providing the second client clock signal to the first integrated circuit comprises providing the second client clock signal to a second client clock signal phase-locked loop in the first integrated circuit.

3. The method of claim 1 wherein encoding the phase change of the first and second client clock signals onto the carrier clock signal comprises encoding a plurality of bits representing the changes in phases of the first and second client clock signals by modulating timing of an edge of the carrier clock signal thereby varying the duty cycle of the carrier clock signal to represent the value of each bit.

4. The method of claim 3 wherein modulating the timing of an edge of the carrier clock signal thereby varying the duty cycle of the carrier clock signal comprises modulating the timing of a falling edge of the carrier clock signal.

5. The method of claim 4 wherein modulating the timing of the falling edge of the carrier clock signal comprises setting the timing of the falling edge of the carrier clock signal to create a duty cycle of less than 50% to represent a first digital bit value and setting the timing of the falling edge of the carrier clock signal to create a duty cycle of 50% to represent a second digital bit value.

6. The method of claim 5 further comprising setting the timing of the falling edge of the carrier clock signal to create a duty cycle of more than 50% to represent a marker bit.

7. The method of claim 1 wherein:
encoding the phase change of the first client clock signal in first bit positions comprises encoding the phase change of the first client clock signal in a first phase word; and
encoding the phase change of the second client clock signal in second bit positions different from the first bit positions comprises encoding the phase change of the second client clock signal in a second phase word.

8. The method of claim 1 further comprising encoding time of day (ToD) information from a ToD counter onto the carrier clock signal in third bit positions different from the first and second bit positions.

9. The method of claim 8 wherein encoding ToD information onto the carrier clock signal in third bit positions comprises encoding (ToD) ToD information as first non-phase word information.

10. The method of claim 8 further comprising encoding data from a messaging channel onto the carrier clock signal in fourth bit positions different from the first and second bit positions and the first non-phase word information in the third bit position.

11. The method of claim 10 wherein encoding data from the messaging channel onto the carrier clock signal in fourth bit positions comprises encoding data from the messaging channel as second non-phase word information.

12. The method of claim 1 further comprising:
receiving in the second integrated circuit the modulated carrier clock signal from the first integrated circuit over the single wire;
decoding the phase change of the first client clock signal with respect to the carrier clock signal from the modulated carrier clock signal;
providing the decoded phase change of the first client clock signal to a first client clock signal phase-locked loop;
decoding the phase change of the second client clock signal with respect to the carrier clock signal from the modulated carrier clock signal;
providing the decoded phase change of the second client clock signal to a second client clock signal phase-locked loop; and
providing the carrier clock signal received in the second integrated circuit to a carrier clock signal phase-locked loop.

13. A system for transferring between a first and a second integrated circuit, over a carrier clock signal, a first client clock signal and a second client clock signal, the system comprising:
the first integrated circuit coupled to the second integrated circuit;
a carrier clock signal phase-locked loop in the first integrated circuit having an input coupled to a reference frequency source of a carrier clock domain;
a first client clock signal phase-locked loop in the first integrated circuit having an input coupled to the first client clock signal;
a second client clock signal phase-locked loop in the first integrated circuit having an input coupled to the second client clock signal;
an encoder circuit in the first integrated circuit configured to:
encode information regarding a phase change of the first client clock signal with respect to the carrier clock signal onto the carrier clock signal in first bit positions;
encode information regarding a phase change of the second client clock signal with respect to the carrier clock signal onto the carrier clock signal in second bit positions different from the first bit positions; and
transmit the carrier clock signal with the encoded information regarding the phase change of the first and second client clock signals over a single communication wire from the first integrated circuit to the second integrated circuit.

14. The system of claim 13 wherein the encoder circuit is further configured to:
encode time of day information onto the carrier clock signal; and
encode data from a messaging channel onto the carrier clock signal.

15. The system of claim 13 further comprising:
a decoder circuit in the second integrated circuit configured to:
receive in the second integrated circuit the carrier clock signal with the encoded information regarding the phase change of the first and second client clock signals from the first integrated circuit over the single communication wire;
decode the phase change information of the first client clock signal from the carrier clock signal; and
decode the phase change information of the second client clock signal from the carrier clock signal;
a carrier clock signal phase-locked loop in the second integrated circuit having an input coupled to the decoder circuit to receive the carrier clock signal;

a first client clock signal phase-locked loop having an input coupled to the decoder to receive the decoded phase change information of the first client clock signal; and a second client clock signal phase-locked loop having an input coupled to the decoder to receive the decoded phase change information of the second client clock signal.

16. The system of claim 15 wherein the decoder is further configured to:

decode time of day information from the carrier clock signal; and decode the data from the messaging channel from the carrier clock signal.

\* \* \* \* \*

UNITED STATES PATENT AND TRADEMARK OFFICE
CERTIFICATE OF CORRECTION

PATENT NO. : 10,917,097 B1
APPLICATION NO. : 16/795520
DATED : February 9, 2021
INVENTOR(S) : Peter Meyer, Kamran Rahbar and Drew Jenkins Page 1 of 1

It is certified that error appears in the above-identified patent and that said Letters Patent is hereby corrected as shown below:

In the Claims

Column 11, Line 53, please delete "(TOD)".

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*